(12) United States Patent
Cheah et al.

(10) Patent No.: US 12,191,281 B2
(45) Date of Patent: Jan. 7, 2025

(54) MULTI-CHIP PACKAGE WITH RECESSED MEMORY

(71) Applicant: Intel Corporation, Santa Clara, CA (US)

(72) Inventors: Bok Eng Cheah, Gelugor (MY); Yang Liang Poh, Bukit Mertajam (MY); Seok Ling Lim, Kulim (MY); Jenny Shio Yin Ong, Bayan Lepas (MY); Jackson Chung Peng Kong, Tanjung Tokong (MY)

(73) Assignee: Intel Corporation, Santa Clara, CA (US)

( * ) Notice: Subject to any disclaimer, the term of this patent is extended or adjusted under 35 U.S.C. 154(b) by 693 days.

(21) Appl. No.: 17/348,802

(22) Filed: Jun. 16, 2021

(65) Prior Publication Data

US 2022/0406753 A1    Dec. 22, 2022

(51) Int. Cl.
| | |
|---|---|
| *H01L 25/18* | (2023.01) |
| *H01L 21/48* | (2006.01) |
| *H01L 21/56* | (2006.01) |
| *H01L 23/13* | (2006.01) |
| *H01L 23/31* | (2006.01) |
| *H01L 23/538* | (2006.01) |
| *H01L 25/00* | (2006.01) |
| *H01L 25/065* | (2023.01) |

(52) U.S. Cl.
CPC ...... *H01L 25/0657* (2013.01); *H01L 21/4853* (2013.01); *H01L 21/486* (2013.01); *H01L 21/565* (2013.01); *H01L 23/13* (2013.01); *H01L 23/3164* (2013.01); *H01L 23/5384* (2013.01); *H01L 23/5386* (2013.01); *H01L 25/18* (2013.01); *H01L 25/50* (2013.01); *H01L 2225/06517* (2013.01); *H01L 2225/06548* (2013.01); *H01L 2225/06558* (2013.01)

(58) Field of Classification Search
CPC ............ H01L 25/0657; H01L 21/4853; H01L 21/486; H01L 21/565
See application file for complete search history.

(56) References Cited

U.S. PATENT DOCUMENTS

| | | | | |
|---|---|---|---|---|
| 2022/0068736 | A1* | 3/2022 | Lo | ............................ H01L 23/24 |
| 2022/0102305 | A1* | 3/2022 | Krishnatreya | .......... H01L 24/80 |
| 2022/0302003 | A1* | 9/2022 | Pan | ...................... H01L 23/5385 |
| 2022/0342150 | A1* | 10/2022 | Karhade | ............... G02B 6/4274 |
| 2022/0344270 | A1* | 10/2022 | Sheng | ..................... H01L 24/73 |

(Continued)

*Primary Examiner* — Thao P Le
(74) *Attorney, Agent, or Firm* — VIERING, JENTSCHURA & PARTNER MBB

(57) ABSTRACT

The present disclosure is directed to semiconductor packages, and methods for making them, which includes a substrate with a top surface and a bottom surface, a substrate recess in the bottom surface of the substrate, a first device positioned over the top surface of the substrate, which has the first device at least partially overlapping the substrate recess, a mold material in the substrate recess, which has the mold material overlapping the bottom surface of the substrate adjacent to the substrate recess, a second device positioned in the substrate recess, and a plurality of interconnect vias in the substrate, which has at least one of the plurality interconnect vias coupled to the first and second devices to provide a direct signal connection therebetween that minimizes signal latency.

20 Claims, 8 Drawing Sheets

(56) References Cited

U.S. PATENT DOCUMENTS

2022/0352082 A1\* 11/2022 Yu .................... H01L 23/5383
2022/0399324 A1\* 12/2022 Then .................. H01L 25/0657
2024/0250067 A1\* 7/2024 Yu ................... H01L 21/76879

\* cited by examiner

MULTI-CHIP PACKAGE WITH RECESSED MEMORY

BACKGROUND

As scaling continues further into the submicron regime, the interconnect design, its electrical properties, and reliability have increasingly gained importance. Conventional interconnect designs have signals propagating through extensive transmission lines across the package substrate to a printed circuit board (PCB) and through multiple interconnect transitions, e.g., vertical vias, capacitive solder balls, sockets, and/or plated-through-hole (PTH) structures. An important consequence of scaling transistor and interconnect dimensions and increasing chip sizes is that the major source for signal propagation delay has shifted from the active transistors to the passive interconnect lines.

To enable greater miniaturization, conventional packaging technology uses die stacking to incorporate two or more chiplets into a vertical assembly. Such designs can increase interconnect distances between devices by their routing requirements and/or planar geometries due to their die stacking hierarchy. It is also known that interconnect placement and wire sizing may have a significant impact on the signal delay from interconnects, and the performance of circuits, especially in deep submicron or nanometer designs that can have significant wire resistance.

Current approaches for reduced signal latency include the mounting of dynamic random access memory (DRAM) packages near the central processing unit (CPU) or graphical processing unit (GPU) package to reduce the interconnect trace length. However, the stacking of DRAM packages on the top side of a system on a chip (SOC) package may require package real-estate and/or package layer count (i.e., z-height) trade-offs due to the side-by-side placement of the DRAM packages with the SOC die(s) and the required footprint for the DRAM signal breakout.

Alternatively, the use of 2.5D and/or 3D integrated circuit packaging may also be used to reduce signal latency between a CPU/GPU and their associated memory devices. The use of 2.5D and 3D architecture permits multiple dies to be positioned inside the same package using an interposer or substrate, which may be a chip or multi-layered structure with through-silicon vias (TSVs) for communication. Such packaging methodology is typically used for applications when performance and low power are critical. However, for 2.5D and/or 3D packaging approaches, there may be increased power loop inductance, higher resistance in the TSV interconnects, package form-factor expansion, and/or warpage control challenges that need to be considered.

The performance of a semiconductor package may also depend on constraints caused by the power delivery networks (PDN). There may be disruptions between the power and ground planes, for example, resulting from having a power plane configured far apart from a ground plane and discontinuties in the power and/or ground planes due to signal routing congestion. The disruptions of the power and ground planes have sought to be addressed by increasing the capacitance requirements through using thin dielectrics, embedded capacitance, high-frequency decoupling capacitors, and other methods.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1:
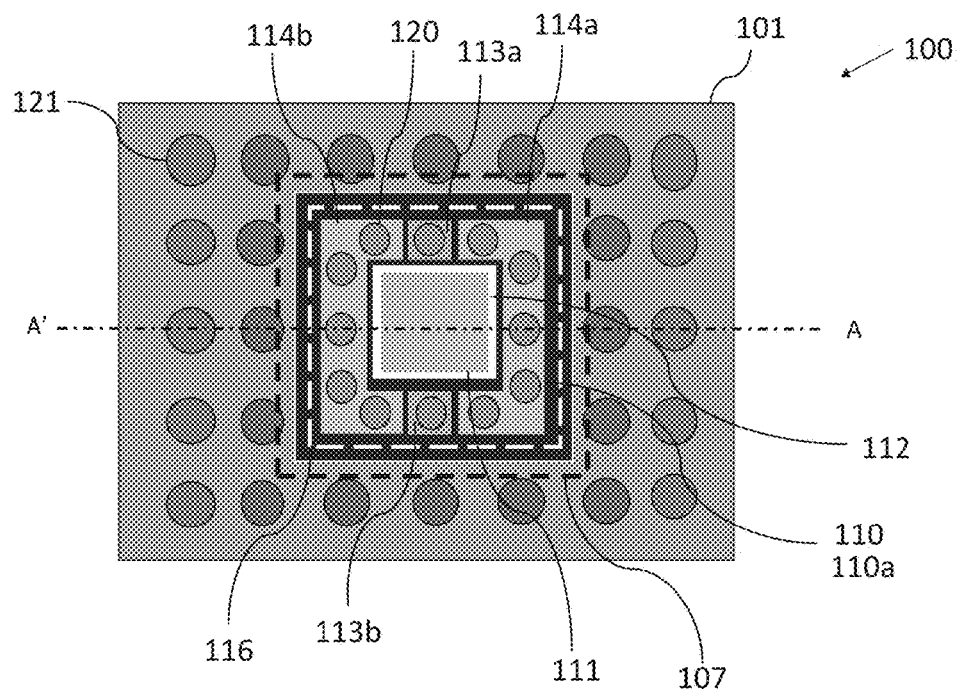
FIG. 1 shows a bottom view layout of a semiconductor package with a recessed memory device according to an aspect of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure generally relates to semiconductor packages that may have a plurality interconnect vias that provide direct signal connections between a first device (e.g., a CPU, GPU, platform controller hub chipset, and/or other processor devices) and a second device (e.g., a DRAM and/or other memory devices) that minimizes signal latency. In addition, it should be understood the first device and the second device, respectively, may include one or more semiconductor dies/chips mounted on a passive substrate or silicon interposer bridge.

In an aspect, the semiconductor package may include a substrate with a top surface and a bottom surface, a substrate recess in the bottom surface of the substrate, a first device positioned over the top surface of the substrate, which has the first device at least partially overlapping the substrate recess, a mold material in the substrate recess, which has the mold material overlapping the bottom surface of the substrate adjacent to the substrate recess, a second device positioned in the substrate recess; and a plurality of interconnect vias in the substrate, which has at least one of the plurality interconnect vias coupling the first and second devices to provide an electrical connection therebetween that minimizes signal latency. In an aspect, the electrical connection may be a direct signal connection.

In an addition aspect, the substrate of the present semiconductor packages may have a substrate core layer with a first metallization layer on a top surface of the substrate core layer and a second metallization layer on a bottom surface of the substrate core layer, which has the substrate recess extending through the second metallization layer and partially through the substrate core layer.

In yet another aspect, the present semiconductor packages may have a mold recess in the mold material disposed in the substrate recess, which may have the second device positioned in the mold recess, and have a printed circuit board with a board recess, which has the board recess aligned with the mold recess.

In a further aspect, the present semiconductor packages may have a substrate recess providing a first angular space and the mold recess providing a second angular space in the substrate recess that is rotationally offset from the first angular space of the substrate recess.

In an aspect, the present semiconductor packages may have at least one power plane in the substrate recess connecting the first device to a printed circuit board, which may have the power plane connected to a power supply reference voltage, and at least one power plane via connected to the power plane, which has a volume for the power plane that is greater than a volume of the power plane via. In addition, the power plane via may be connected to the second device.

The technical advantages of the present disclosure include, but not limited to, improved signal latency between a processor/system-on-chip and memory devices, through reduced interconnect length, and improved device data transmission bandwidth, which may be shown by the results in Table 1 below, and reduced power consumption.

TABLE 1

LPDDR5 Eye Margin Comparisons

| | Eye Margin | |
|---|---|---|
| Data Rate (MT/s) | POR (DRAM-On PCB) | Invention (DRAM on Package Recess) |
| 6400 | 9 mV/7 ps (0.04UI) | 90 mV/44 ps (0.28UI) |
| 7500 | Negative Margin | 64 mV/25 ps (0.18UI) |
| 8500 | Negative Margin | 27 mV/13 ps (0.11UI) |

The eye opening methodology may be used to analyze the quality of an electrical signal transmission and the results above in Table 1 show improvements in both the electrical eye opening margin (e.g., 81 mV/37ps margin improvements at 6400 MT/s) and the data rate scaling (e.g., 27 mV/13ps margins at 8500 MT/s) using the present semiconductor package when compared with the standard package configurations. The present semiconductor package provides improved signal integrity through minimized channel impedance discontinuities, reduced signal crosstalk couplings and channel insertion losses.

In addition, the present semiconductor package may provide improved system power integrity through a smaller AC power loop inductance by placing the DRAM in proximity to the power and ground planes, as well as reduced DC resistance through increased metal volume achieved through the large power planes of the present disclosure.

In other aspects, the configuration of the present semiconductor provides greater package miniaturization through an overlapping arrangement of the silicon die and the DRAM as compared with a side-by-side placement footprint. In addition, there is improved mechanical integrity and improved warpage control that is achieved by placing the power delivery network within a package recess.

To more readily understand and put into practical effect the present semiconductor package, particular aspects will now be described by way of examples that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

In the aspect shown in FIG. 1, a bottom view layout of a semiconductor package 100 having a first device 107 (shown as black colored dashed lines), which may be a CPU chip 107, and a second device 111, which may be a memory device 111, is provided according to the present disclosure. This representative layout, as well as for the following layout drawings, provides the approximate footprints for the various selected features of the present semiconductor packages and their relative positions in the semiconductor packages, which may be situated on different levels thereof.

Figure 1A:
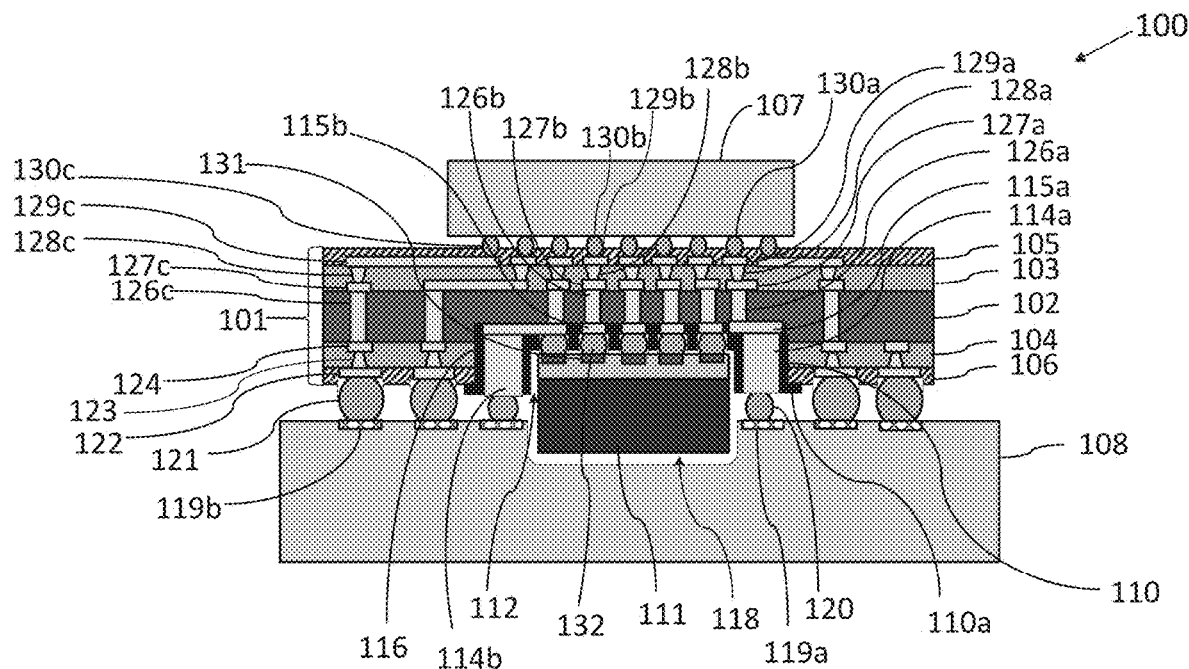
FIG. 1A shows a cross-sectional view along the A-A' line of the semiconductor package shown in FIG. 1.

In this aspect, a substrate 101 may have a substrate recess 116 (shown as white-colored dashed lines). A CPU chip 107 may be positioned fully or partially over the substrate recess 116. The substrate recess 116 may have a mold material 110 that at least partially fills the substrate recess 116 and a mold material step 110a, which overlaps the edges of the substrate recess 116 (as shown in FIG. 1A). The mold material 110 may have a mold recess 112 that may be situated within the boundaries of the substrate recess 116. A memory device 111 may be positioned in the mold recess 112 and hence becoming a recessed memory device. While not required, the shape of a mold recess may closely conform to the shape of a memory device being positioned therein.

Also, the substrate recess 116 may have one or more power planes and one or more ground planes positioned adjacent to the recessed memory device. As shown in FIG. 1, there are two power planes, 114a, and 114b, and two ground planes, 113a and 113b that are embedded in the mold material 110 and situated around the periphery of the recessed memory device 111. In an aspect, by having a power plane in close proximity to a ground plane, the AC loop inductance may be reduced.

The configuration, as well as the size and shape, of the one or more power planes and the one or more ground planes in a substrate recess may be adjusted pursuant to particular design considerations and may be situated at one, two, or three sides of the periphery of the recessed memory device according to the present disclosure.

While the substrate recess 116 may be shown to be approximately square-shaped, it is within the scope of the present disclosure for a substrate recess to have a variety of shapes (e.g., rectangular, circular, symmetrical, and non-symmetrical angular and/or smooth shapes, etc.), as may be required. Similarly, the mold recess 112 is shown to be approximately square-shaped, however, it is within the scope of the present disclosure for a mold recess to have a variety of shapes (e.g., rectangular, circular, symmetrical, and non-symmetrical angular and/or smooth shapes, etc.).

In another aspect of the semiconductor package 100, as shown in FIG. 1, a first plurality of solder balls 120 may be positioned on the ground planes 113a and 113b and the power planes 114a and 114b, and a second plurality of solder balls 121 may be positioned on the substrate 101. The first and second plurality of solder balls 120 and 121 electrically couple the substrate 101 to a printed circuit board 108 and other device components thereon.

In FIG. 1A, a cross-sectional view along the A-A' line of the semiconductor package 100 in FIG. 1 is shown. The semiconductor package 100 includes a substrate 101 having a plurality of plated through hole (PTH) vias formed in the substrate 101. The substrate 101 includes substrate core layer 102 with a plurality of vertical interconnect vias 126 extending from a top surface to a bottom surface of the substrate core layer 102, which includes the vertical interconnect vias 126a, 126b, and 126c shown in FIG. 1A. In an aspect, for the PTH, there may be generally three types—a first to facilitate power delivery, a second to facilitate ground reference or current return path, and a third to facilitate electrical signal transmission.

According to the present disclosure, the substrate core layer of the present disclosure may be formed from organic-based materials (e.g., epoxy resins, polyester resin, vinyl ester, and/or ceramic polymer layer), or from semiconductor materials (e.g., silicon or glass substrate materials). In a particular aspect, the substrate core layer may be made of a bismaleimide triazine (BT) epoxy layer with reinforced fiber glasses.

In another aspect of FIG. 1A, the top surface of substrate core layer 102 includes a first dielectric layer 103 and a first resist layer 105 positioned thereon, and the bottom surface of substrate core layer 102 includes a second dielectric layer 104 and a second resist layer 106 positioned thereon. The plurality of vertical interconnect vias 126 may be coupled to a first metallization layer 127, which is formed on the top surface of the substrate core layer 102 and includes portions 127a, 127b, and 127c. The first metallization layer 127 may be coupled by a first plurality of vertical connect vias 128 which are formed in the first dielectric layer 103 and include vias 128a, 128b, and 128c, to a second metallization layer 129, which is formed on the first dielectric layer 103 and includes portions 129a, 129b, and 129c. The first metallization layer 127, the first plurality of vertical connect vias 128 and the second metallization layer 129 may constitute a first metal build-up layer.

In addition, the plurality of vertical interconnects vias 126 may be selectively coupled to a third metallization layer 124, which is formed on the bottom surface of the substrate core layer 102. The third metallization layer 124 may be coupled by a second plurality of vertical connect vias 123, which are formed in the second dielectric layer 104, to a fourth metallization layer 122, which is formed on the second dielectric layer 104. The third and fourth metallization layers 124 and 122 may not be required at the locations where a substrate recess will be formed. The third metallization layer 124, the second plurality of vertical connect vias 123, and the fourth metallization layer 122, which together may constitute a second metal build-up layer. The present first and second metal build-up layers may include a plurality of additional metallization and dielectric layers.

In an aspect, the semiconductor package 100 includes a substrate recess 116 that may be formed by removing portions of the second resist layer 106, the second dielectric layer 104, and the substrate core layer 102, as well as portions of the vertical interconnect vias 126 positioned above the substrate recess 116. The substrate recess 116 includes a substrate recess connection layer 115, which includes portions 115a, i.e., a connection trace and/or plane, and 115b, i.e., a contact pad. The portions 115a and 115b of the substrate recess connection layer 115 are electrically coupled to the vertical interconnect vias 126a and 126b, respectively, which are positioned above the substrate recess 116.

In an aspect, a mold material 110 may be deposited in the substrate recess 116 and have a mold material step 110a overlapping the periphery of the substrate recess 116. In addition, a mold recess 112 is formed in mold material 110. The mold material 110 may provide rigidity, along with a degree of flexibility, and may be formed of materials such as epoxy resin polymer, silicone polymer, and/or polyimide materials. In a particular aspect, the mold material 110 may be an epoxy polymer resin with silica filler.

In FIG. 1A, there are two power planes 114a and 114b are formed in the mold material 110 and there are two ground planes 113a and 113b that are not shown in this view. There may be at least one power plane and at least one ground plane positioned in a substrate recess. In an aspect, the power planes may extend beyond the second metal build-up layer (i.e., a body of a power plane extending past the bottom surface of the substrate) to further increase the total volume of the power planes for improved power integrity (i.e., further direct current resistance (DCR) reduction). The power planes may be associated with one or more power supply reference voltages (Vcc), e.g., a power supply rail with 0.5 Volt (V), a power supply rail with 0.8 V, a power supply rail with 1.8 V, or a power supply rail with 3.3 V. The ground planes may be associated with a ground reference voltage (Vss).

In addition, comparing a first metal volume for the vertical interconnect 126a and a second metal volume for the power plane 114a, the second metal volume is designed to greater than the first metal volume for improved power integrity i.e., DCR reduction. In an aspect, depending on a design volume for a second metal volume for a power plane, a possible DCR reduction may be in a range of 20 to 50 percent.

For the semiconductor package 100 shown in FIG. 1A, a first device 107 and a second device 111 may be attached to the substrate 101. The first device 107 may have a plurality of solder bumps 130, which includes the solder bumps 130a, 130b, and 130c shown in FIG. 1A. The second device 111 may be positioned in the mold recess 112 and have a plurality of contact pads 131 with solder balls 132 that are aligned with and coupled to the portions of substrate recess connection layer 115. In an aspect, the path from the first device 107 through the solder bump 130b, the second metallization layer 129b, the vertical connect via 128b, the first metallization layer 127b, the interconnect via 115b through the solder ball 132, and the contact pad 131 on the second device is configured to facilitate electrical signal transmissions and the shortest distance therebetween. In an aspect, to obtain the shortest distance, the first device 107 may be positioned over the second device 111 to at least partially vertically overlap.

In an aspect, the first device may include one or more silicon dies; for example, a central processing unit (CPU), a graphic processing unit (GPU), a platform controller hub (PCH) chipset disposed on the first metal build-up layer. In another aspect, the one or more silicon dies may include a three-dimensional (3D) stacked integrated circuit (IC) configuration and a 3D stacked IC configuration with one or more silicon interposers. In a further aspect, the second device may include a memory device, for example, a DRAM package or a plurality of DRAM dies, positioned in the mold recess.

As shown in FIG. 1A, the substrate 101 may be mounted on a printed circuit board 108 having a board recess 118. The plurality of small solder balls 120 on the substrate 101 are aligned with and positioned on contact pads 119*a* on the print circuit board 118, while the plurality of large solder balls 121 on the substrate 101 are aligned with and positioned on contact pads 119*b* on the print circuit board 118. In an aspect, the small solder balls 120 may have a diameter in the range of between 50 µm to 300 µm, and the large solder balls 121 may have a diameter in the range of between 100 µm to 500 µm. In another aspect, the second chip 111 may be aligned with and positioned in the board recess 118. The board recess 118 is required only if the height of the second device 111 is unable to be fully accommodated by a stand-off height of the solder balls 120 and 121.

Figure 2:
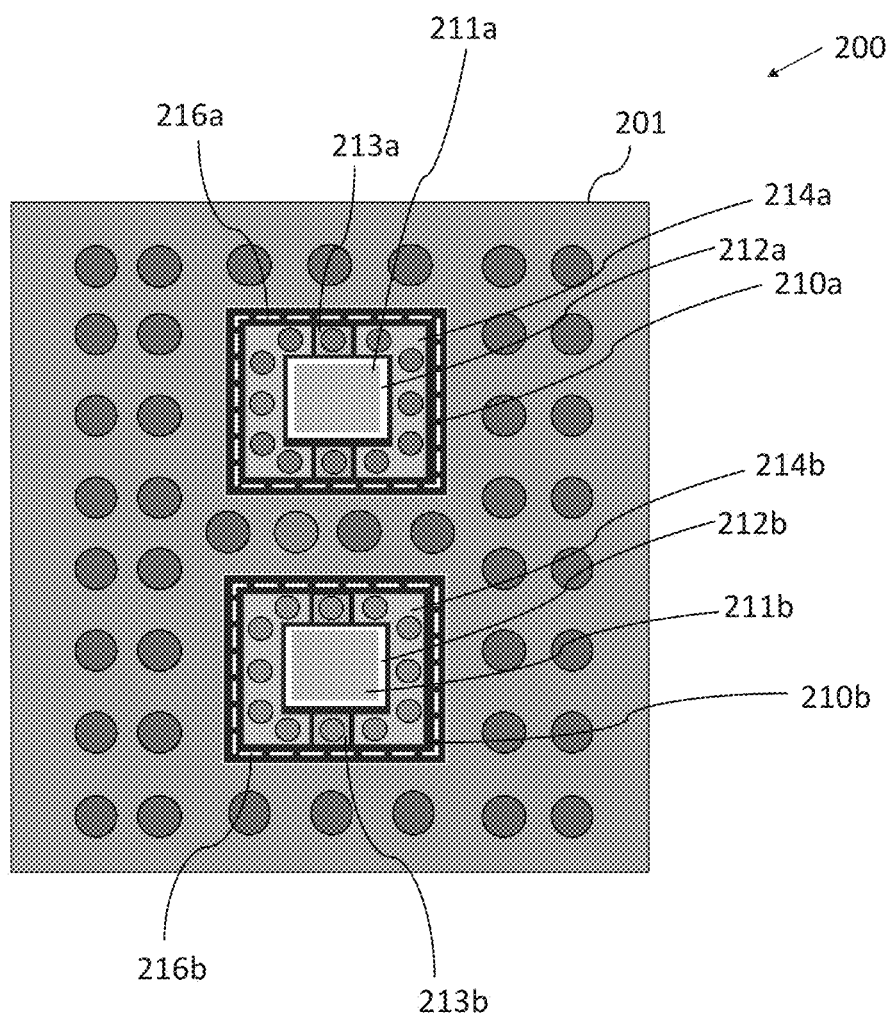
FIG. 2 shows a bottom view layout of a semiconductor package with two recessed memory devices according to another aspect of the present disclosure.

According to the present disclosure, FIG. 2 shows a bottom view layout of the semiconductor package 200 having two recessed memory devices 211*a* and 211*b*. In this aspect, a substrate 201 may have two substrate recesses 216*a* and 216*b* (shown as white colored dashed lines). Although not shown, CPU chips or processor chiplets may be positioned fully or partially over the substrate recesses 216*a* and 216*b*. It is within the scope of the present disclosure for a present semiconductor package to have a substrate with several substrate recesses and the accompanying structures as described herein.

In another aspect of FIG. 2, the substrate recesses 216*a* and 216*b* may have a mold material 210*a* and 210*b*, respectively, that at least partially fill and overlap the edges of the substrate recesses 216*a* and 216*b* (similar to that shown in FIG. 1A). The mold material 210*a* and 210*b* may have mold recesses 212*a* and 212*b*, respectively, situated within the boundaries of the substrate recesses 216*a* and 216*b*. A recessed memory device 211*a* may be positioned in the mold recess 212*a*, and a recessed memory device 211*b* may be positioned in the mold recess 212*b*.

In another aspect, the substrate recess 216*a* may have at least one power plane 214*a* and at least one ground plane 213*a* positioned adjacent to the recessed memory device 211*a*, and the substrate recess 216*b* may have at least one power plane 214*b* and at least one ground plane 213*b* positioned adjacent to the recessed memory device 211*b*. The power plane 214*a* and ground plane 213*a* are embedded in the mold material 210*a*, and the power plane 214*b* and ground plane 213*b* are embedded in the mold material 210*b*.

The number, configuration, size, and shape of the power planes and the ground planes in a substrate recess may be adjusted pursuant to particular design considerations according to the present disclosure. It is within the scope of the present disclosure for a first substrate recess to have a single power plane and single ground plane while a second substrate recess may have two or more power planes and two or more ground planes.

Figure 3:
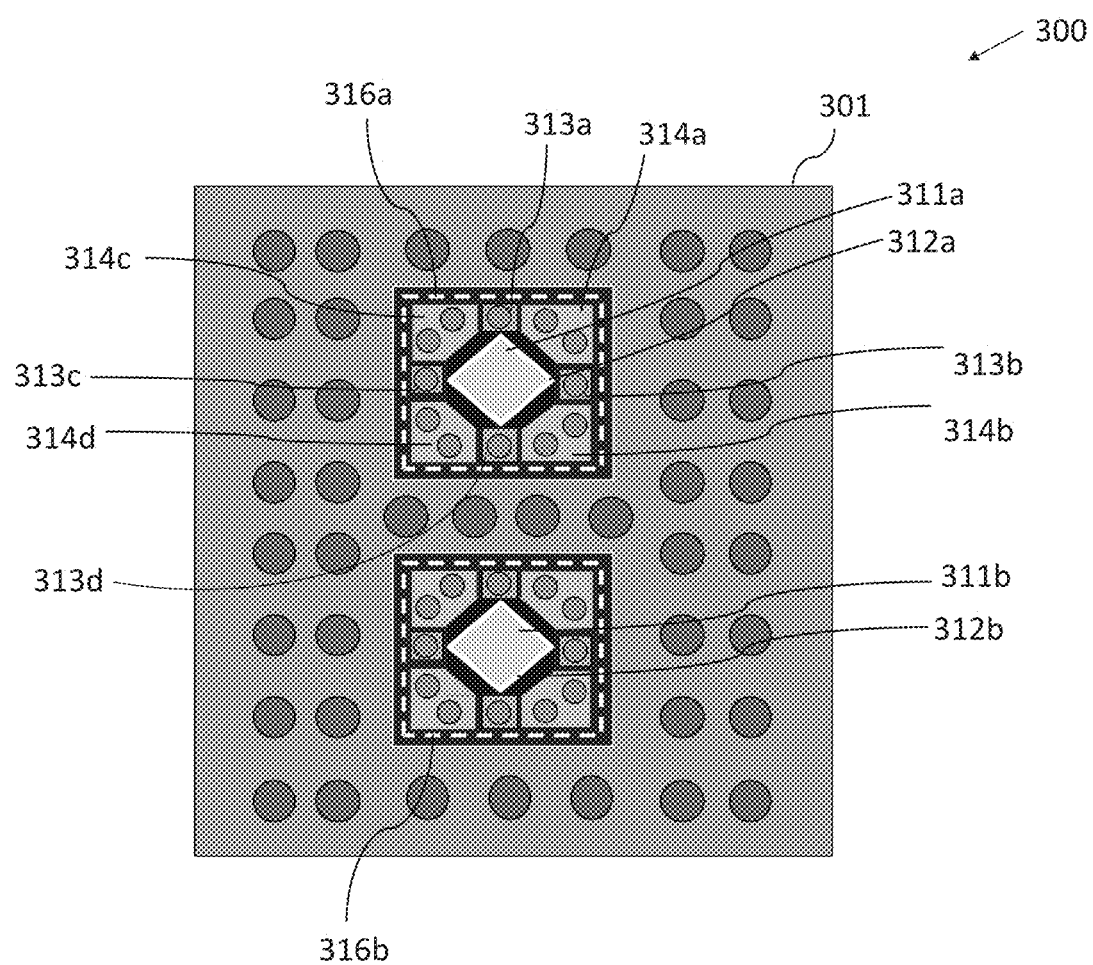
FIG. 3 shows a bottom view layout of a semiconductor package with two recessed memory devices according to a further aspect of the present disclosure.

According to the present disclosure, FIG. 3 shows a bottom view layout of the semiconductor package 300 having two recessed memory devices 311*a* and 311*b*. In this aspect, a substrate 301 may have two substrate recesses 316*a* and 316*b* (shown as white-colored dashed lines).

In this aspect shown in FIG. 3, the substrate recesses 316*a* and 316*b* provide a first angular spaces, which are approximately square-shaped, and the mold recesses 312*a* and 312*b* provide a second angular spaces, which are approximately square-shaped, situated within the substrate recesses 316*a* and 316*b*, respectively, that are rotationally offset from the first angular spaces of the substrate recesses 316*a* and 316*b*. The offset between the substrate recess 316*a* and the mold recess 312*a* may be, for example, approximately 45° from a parallel orientation of their designated horizontal sides. In a further aspect, the range of the offset may be approximately between 10° and 80°.

Also, in FIG. 3, the substrate recess 316*a* may have four power planes, 314*a*, 314*b*, 314*c* and 314*d*, and four ground planes, 313*a*, 313*b*, 313*c*, and 314*d*, situated around the periphery of the recessed memory device 311*a* that is situated in the rotated mold recess 312*a*. In a further aspect, according to the present disclosure, an offset may allow for scalability of the power plane areas to meet a desired volume for an optimal DCR and/or for ball map optimization for package form factor miniaturization.

The present disclosure generally further relates to a method of forming a semiconductor package that may have operations for providing a substrate with a top surface and a bottom surface and forming a plurality of metallization layers on a substrate core layer that are the top and bottom surfaces of the substrate, forming a plurality of interconnect vias therein, and forming a substrate recess in the bottom surface of the substrate for supporting one or more stacked devices.

In a further aspect, the method includes depositing a mold material in the substrate recess and the bottom surface of the substrate and selectively removing the mold material from the bottom surface of the substrate to form a mold material step overlapping the bottom surface of the substrate layer adjacent to the substrate recess.

In an additional aspect, the method includes a first device positioned over the top surface of the substrate, which has the first device at least partially overlapping the substrate recess, and a second device positioned in the substrate recess and coupling the first and second devices to at least one of the plurality interconnect vias to provide a direct signal connection therebetween that minimizes the signal latency.

To more readily understand and put into practical effect the method of forming the present semiconductor package, particular aspects will now be described by way of examples that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

FIGS. 4A through 4J provide cross-sectional views of a semiconductor package 400 to show an exemplary process flow for making the semiconductor package 400 with a recessed memory device 411 that is positioned at the bottom surface of the substrate 401 according to aspects of the present disclosure. The semiconductor package 400 is comparable to and has similar structures as the semiconductor package 100 disclosed above.

Figure 4A:
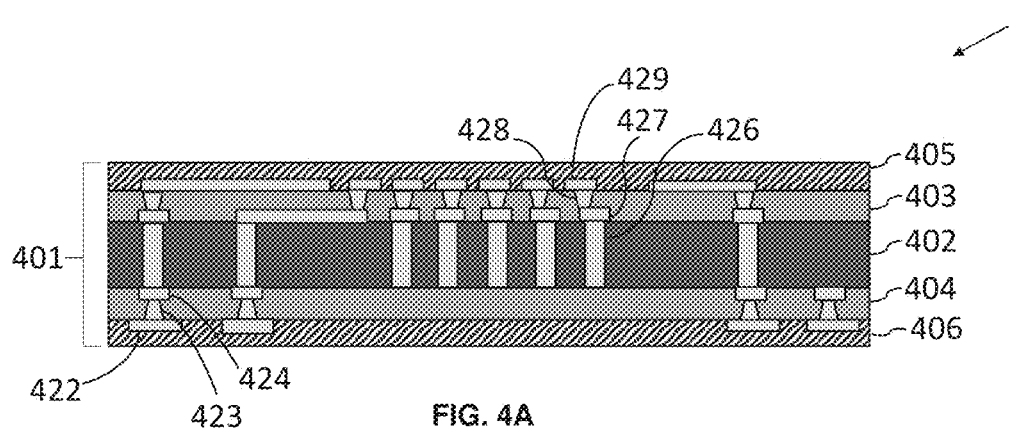
FIGS. 4A through 4J show cross-sectional views directed to an exemplary process flow for making a semiconductor package with a recessed memory device that is positioned on the bottom surface of a substrate according to aspects of the present disclosure.

In FIG. 4A, the semiconductor package 400 is shown with a substrate 401 having a plurality of plated through hole vias formed in the substrate 401. The substrate 401 includes substrate core layer 402 with a plurality of vertical interconnect vias 426 extending from a top surface to a bottom surface of the substrate core layer 402. The top surface of substrate core layer 402 includes a first dielectric layer 403 and a first resist layer 405 positioned thereon and the bottom surface of substrate core layer 402 includes a second dielectric layer 404 and a second resist layer 406 positioned thereon.

According to the present disclosure, the plurality of vertical interconnect vias 426 may be coupled to a first metallization layer 427, which is formed on the top surface of the substrate core layer 402. The first metallization layer 427 may be coupled by a first plurality of vertical connect vias 428, which are formed in the first dielectric layer 403, to a second metallization layer 429, which is formed on the first dielectric layer 403. The first metallization layer 427, the first plurality of vertical connect vias 428, and the second metallization layer 429, which together may constitute a first metal build layer, are formed by a series of commonly used deposition and patterning process steps.

Figure 4B:
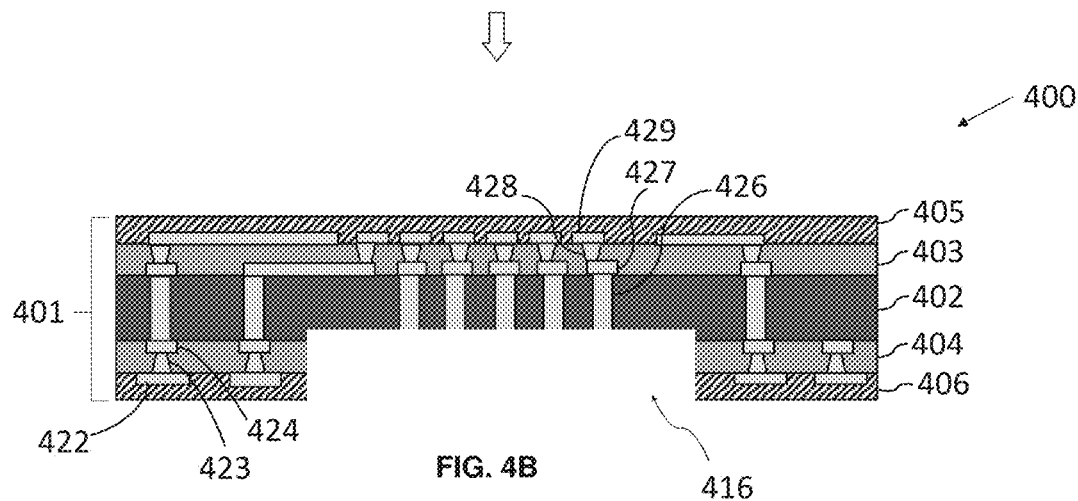

According to the present disclosure, the plurality of vertical interconnects vias 426 may be selectively coupled to a third metallization layer 424, which is formed on the bottom surface of the substrate core layer 402. The third metallization layer is not required at the locations where a substrate recess will be formed as shown in FIG. 4B below. The third metallization layer 424 may be coupled by a second plurality of vertical connect vias 423, which are formed in the second dielectric layer 404, to a fourth metallization layer 422, which is formed on the second dielectric layer 404. The third metallization layer 424, the second plurality of vertical connect vias 423, and fourth metallization layer 422, which together may constitute a second metal build layer, are formed by a series of commonly used deposition and patterning process steps.

In FIG. 4B, according to a further aspect in forming the semiconductor package 400, a substrate recess 416 is formed. An opening for the substrate recess 416 may be formed by a laser or mechanical drilling processing step that removes portions of the second resist layer 406, the second dielectric layer 404, the substrate core layer 402 and portions of the vertical interconnect vias 426 positioned within the substrate recess 416.

Figure 4C:
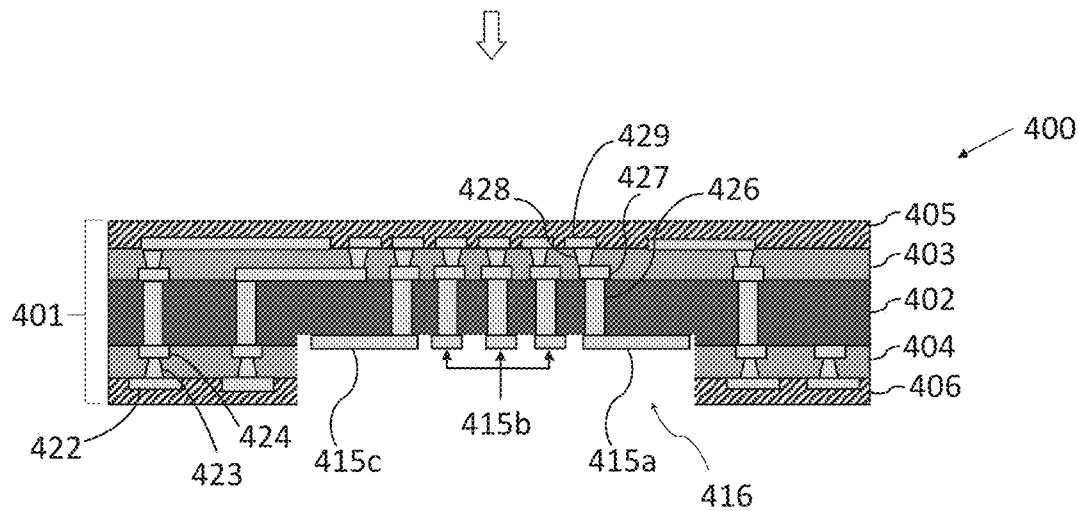

In FIG. 4C, according to a further aspect in forming the semiconductor package 400, a substrate recess connection layer 415 is formed. The substrate recess 416 may be provided with a layer of a conductive material, e.g., copper, using an electroless and/or an electrolytic plating process to form the substrate recess connection layer 415. The substrate recess connection layer 415 is patterned using photolithography, i.e., photo-resist lamination and etching, to form portions 415a, 415b, and 415c, i.e., contact pads and connection lines. The portions 415a, 415b, and 415c of the substrate recess connection layer 415 are electrically coupled to the vertical interconnect vias 426 positioned above the substrate recess 416.

Figure 4D:
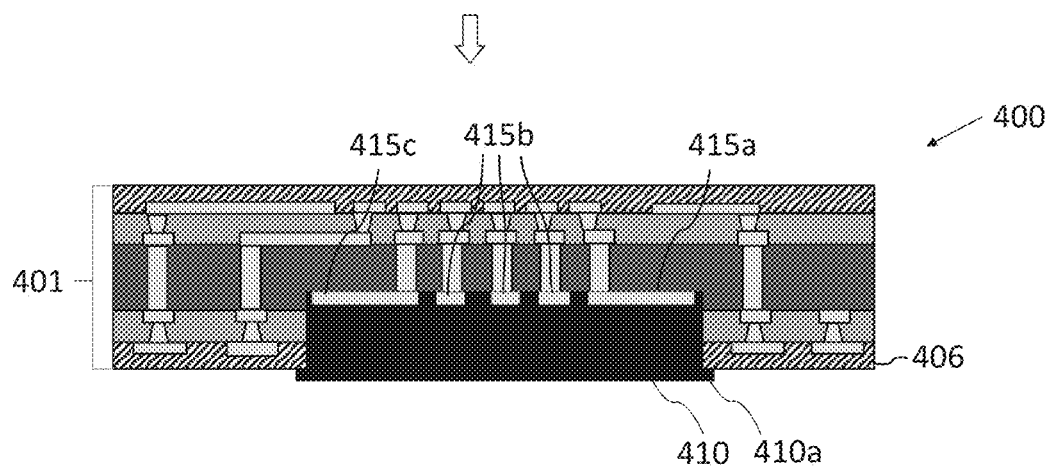

In FIG. 4D, according to a further aspect in forming the semiconductor package 400, a mold material 410 may be deposited in the substrate recess 416. The mold material may also separate the portions 415a, 415b, and 415c of the substrate recess connection layer 415. The mold material 410 may be placed or deposited in the substrate recess 416 and on the bottom surface of the substrate 401 using conventional methods, e.g., transfer molding, compression molding, injection molding, etc. The mold material 410 may provide rigidity, along with a degree of flexibility, and may be formed of materials such as epoxy resin polymer, silicone polymer, and/or polyimide materials.

In this aspect, the mold material 410 and a mold material step 410a around the periphery of the substrate recess 416 may be form in a single step using, for example, a mold chasis design that has a footprint larger than that of a substrate recess.

Figure 4E:
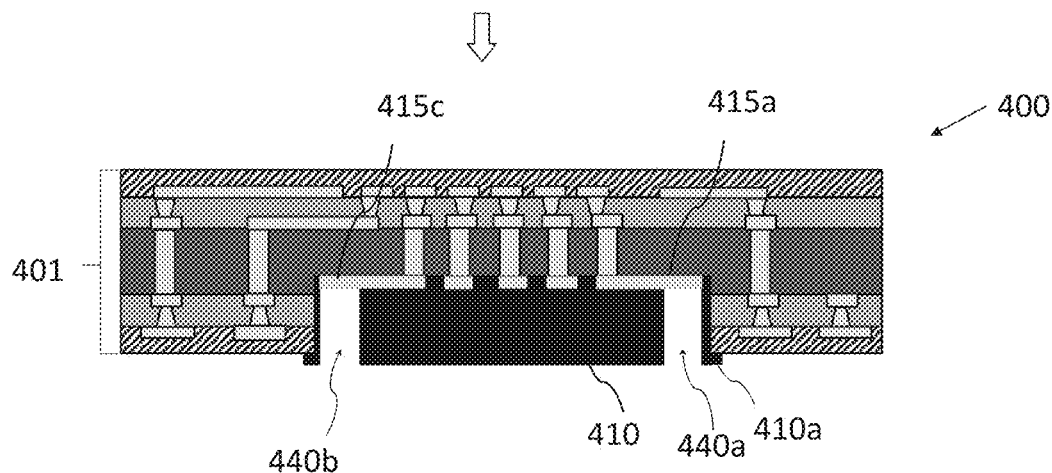

In FIG. 4E, according to a further aspect in forming the semiconductor package 400, openings for the power planes, as well as the openings for the ground planes (not shown), are formed in the mold material 410. The openings 440a and 440b may be formed by a laser or mechanical drilling, and/or etching processing step that removes portions of the mold material 410. The openings 440a and 440b provide spaces for power planes to connect with the portions 415a and 415c of the recess connection layer 415.

Figure 4F:
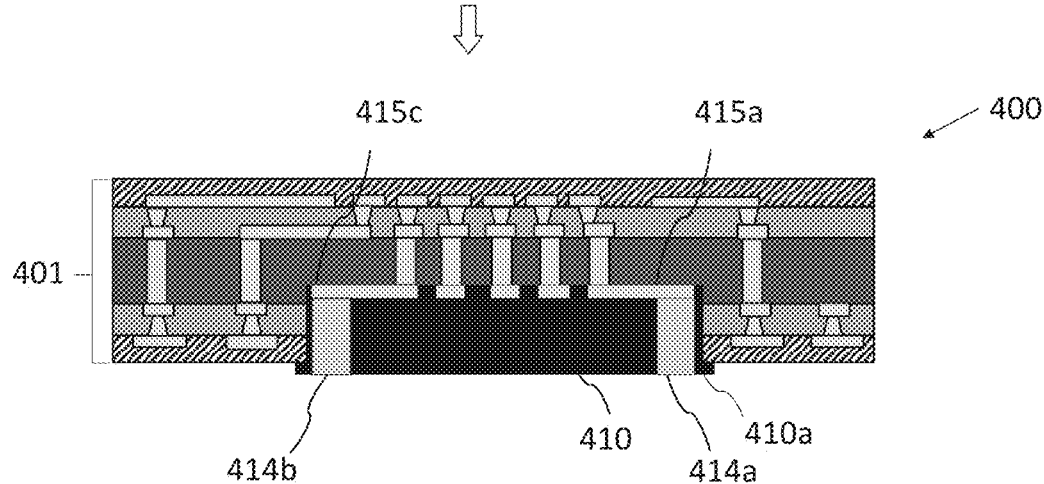

In FIG. 4F, according to a further aspect in forming the semiconductor package 400, two power planes 414a and 414b are formed in the mold material 410. The openings 440a and 440b are filled with a conductive material, e.g., copper, using an electroless and/or an electrolytic plating process, or solder composites, using a solder paste printing, to form the two power planes 414a and 414b and ground planes (not shown). The power and ground planes may be planarized by standard mechanical grinding/polish processes after they are formed. In this aspect, the mold material 410 may be planarized together with the power and ground planes.

According to the present disclosure, for aspects related to forming the substrate recess connection layer, the power and ground planes of conductive material above, the choice between an electroless and electrolytic process may be based on the electroless process not requiring the application of an external electrical current to drive the deposition, whereas the electrolytic process does. In addition, an electroless process uses a chemical reducing agent within its solution chemistry which will result in nearly uniform deposition on all surfaces that are wetted by the chemistry.

Figure 4G:
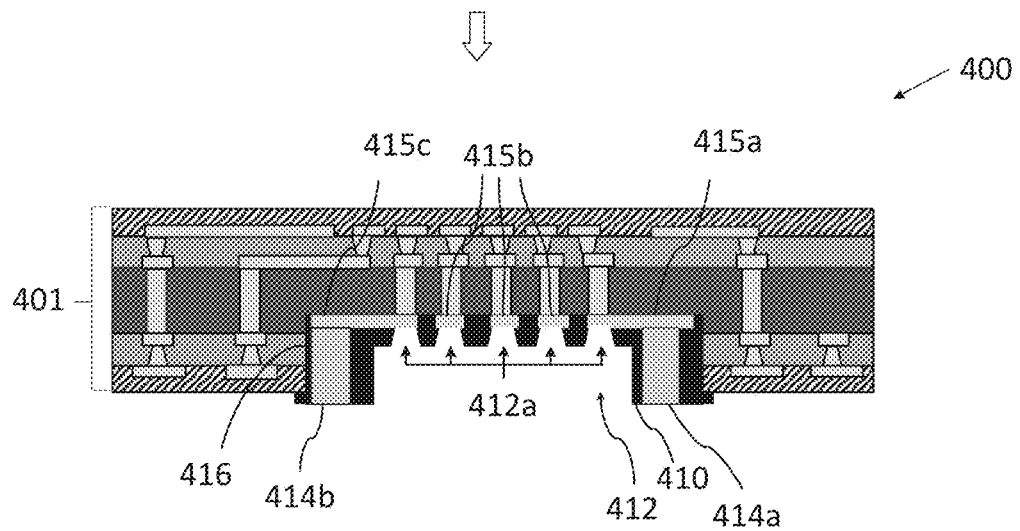

In FIG. 4G, according to a further aspect in forming the semiconductor package 400, a mold recess 412 is formed in mold material 410. The mold recess may be formed by, as a first step, laser or mechanical drilling, and/or etching processing that removes a portion of the mold material 410. A second step may be used to form recess openings 412a by laser or mechanical drilling, and/or etching process that forms the recess contact openings 412a to connect with the portions 415a, 415b and 415c of the recess connection layer 415, which may be contact pads.

Figure 4H:
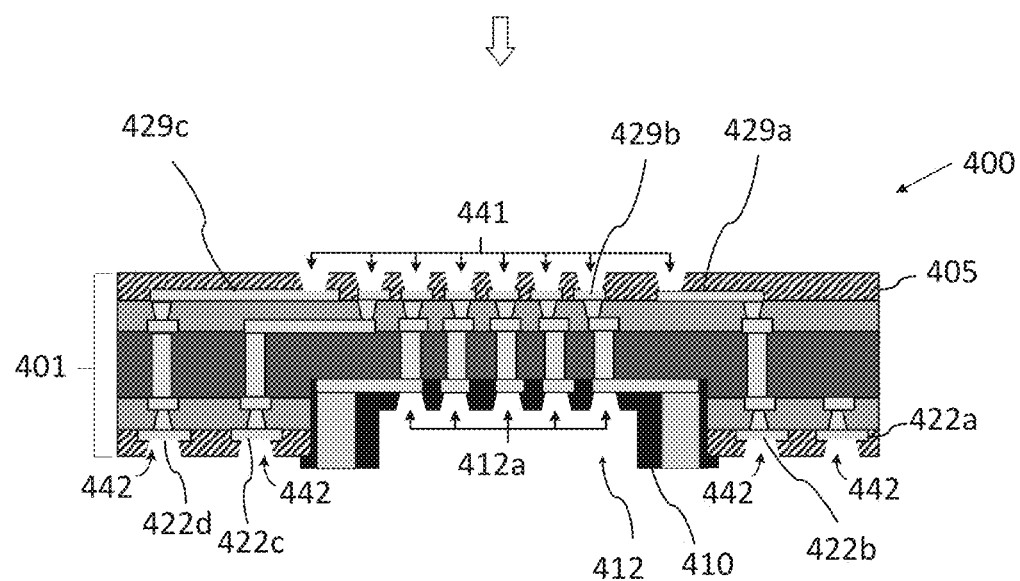

In FIG. 4H, according to a further aspect in forming the semiconductor package 400, top openings 441 are formed in the first resist layer 405 to expose portions of the second metallization layer 429, and bottom openings 442 are formed in the second resist layer 406 to expose portions of the fourth metallization layer 422. The top openings 441 and bottom openings 442 may be formed by a photolithography process, e.g., an ultra-violet (UV) photoresist development and a wet etching. It is also possible to use reactive ion etching to form the openings.

Figure 4I:
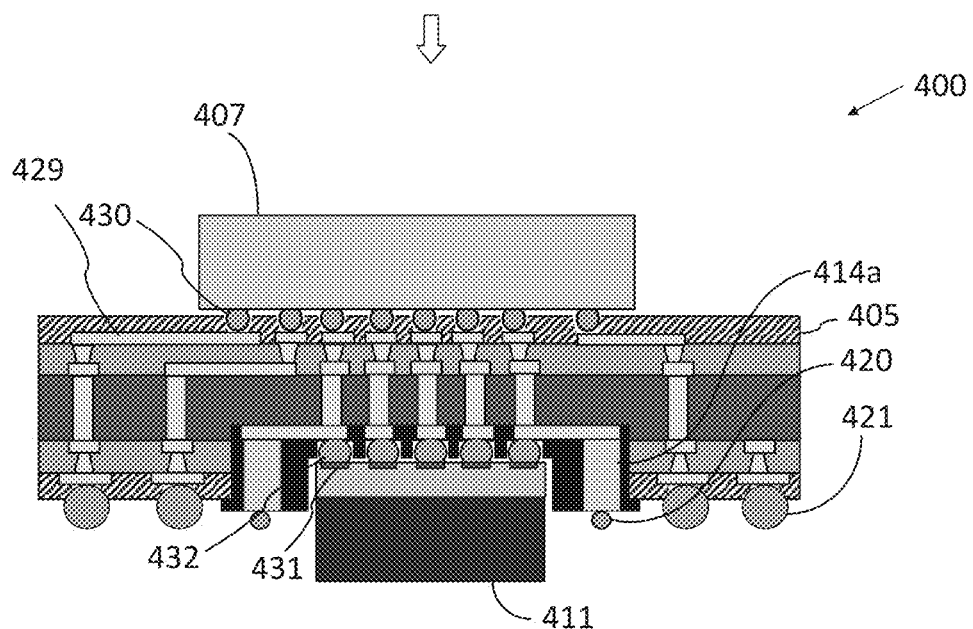

In FIG. 4I, according to a further aspect in forming the semiconductor package 400, a first device 407 and a second device 411 are attached to the substrate 401. The first device 407 may have a plurality of solder bumps 430 that are aligned with and positioned in the top openings 441, and the second device 411 may have a plurality of contact pads 431 with solder balls 432 that are aligned with and positioned in the recess contact openings 412a. The coupling of the first and second devices may use conventional methods, including solder bonding, thermal compression bonding, or other surface mounting methods. In addition, a plurality of large solder balls 421 are placed in the bottom openings 442 and a plurality of small solder balls 420 are placed on the power planes 414a and 414b and the ground planes (not shown).

Figure 4J:
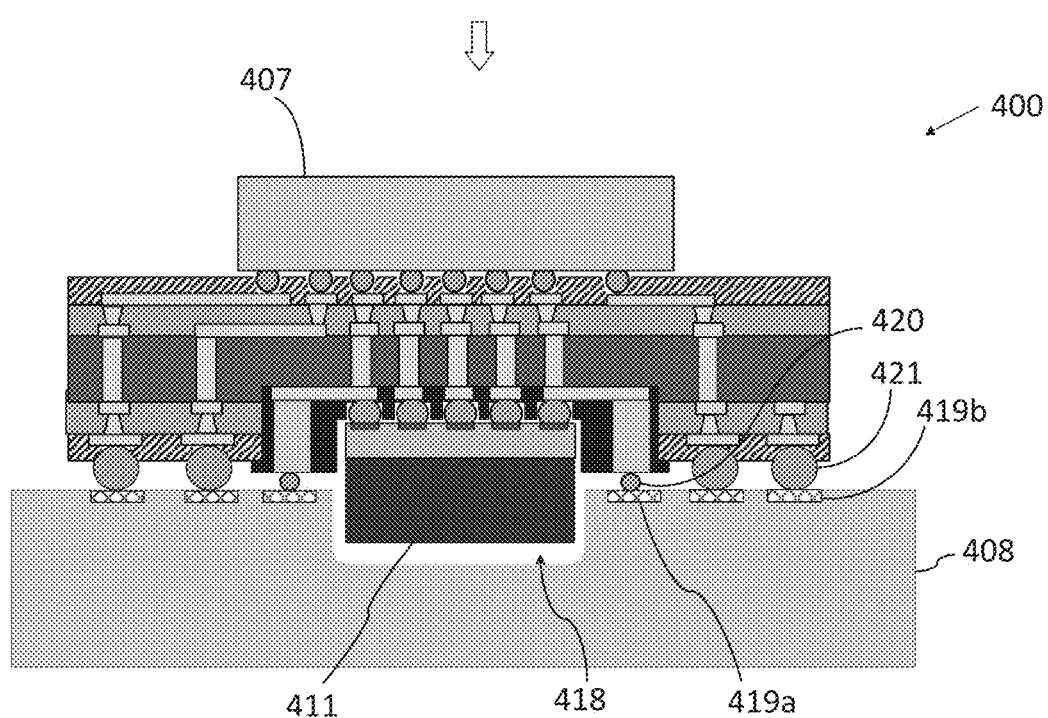

In FIG. 4J, according to a further aspect in forming the semiconductor package 400, the substrate 401 may be mounted on a printed circuit board 408 having a board recess 418. The plurality of small solder balls 420 on the substrate 401 are aligned with and positioned on a plurality of contact pads 419a on the print circuit board 418, while the plurality of large solder balls 421 on the substrate 401 are aligned with and positioned on a plurality of contact pads 419b on the print circuit board 418. In another aspect, the second device 411 is aligned with and positioned in the board recess 418. The coupling of the substrate 401 to the printed circuit board 408 may use conventional methods, including solder reflow, thermal compression bonding, or other surface mounting methods.

The fabrication methods and the choice of materials presented above are intended to be exemplary for forming the present semiconductor packages. It will be apparent to those ordinary skilled practitioners that the foregoing process operations may be modified without departing from the spirit of the present disclosure.

Figure 5:
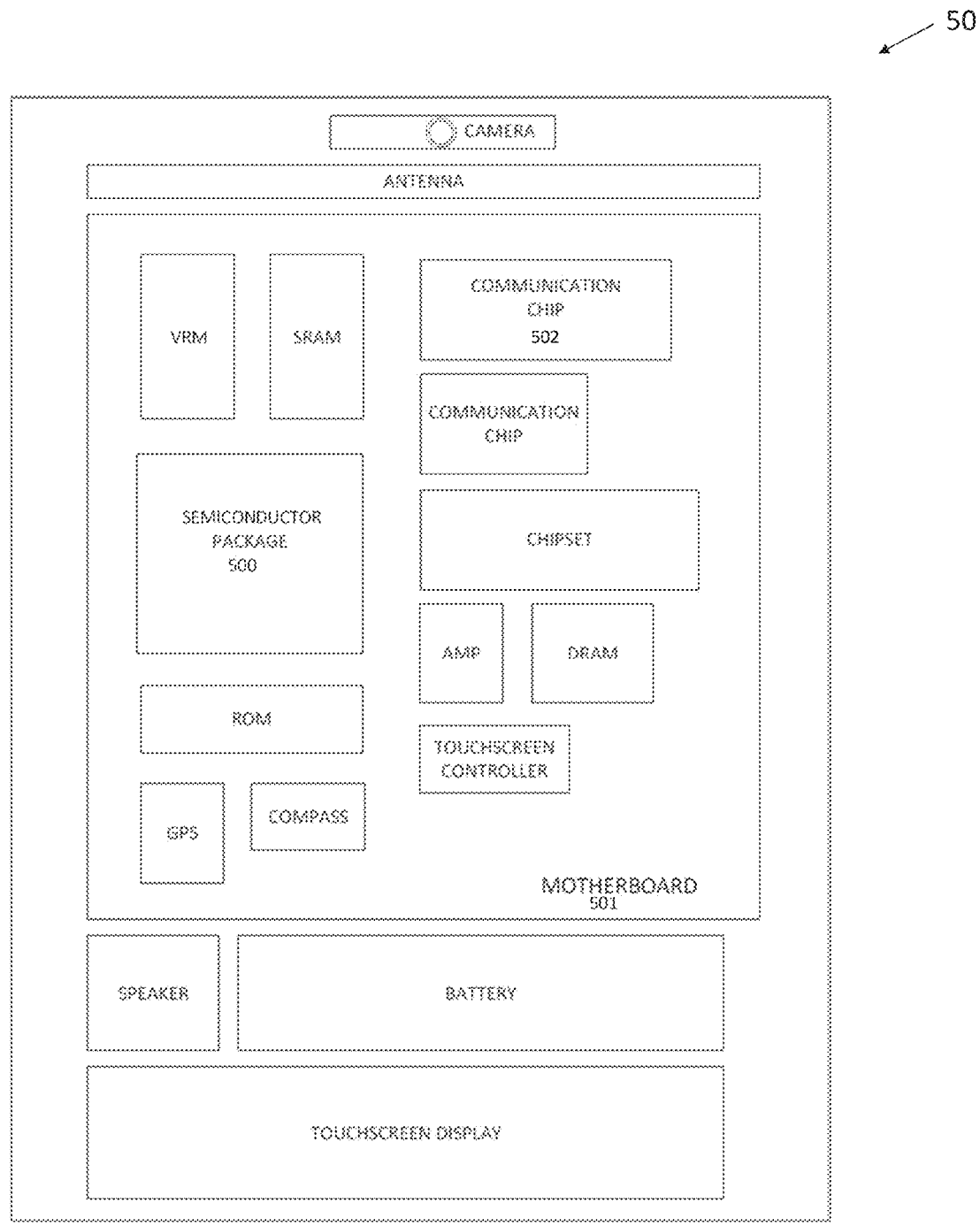
FIG. 5 shows an illustration of a computing device that includes a present semiconductor package according to a further aspect of the present disclosure.

Aspects of the present disclosure may be implemented into a system using any suitable hardware and/or software. FIG. 5 schematically illustrates a computing device 50 that may include a semiconductor package 500 as described herein, in accordance with some aspects.

According to the present disclosure, the computer device may include a printed circuit board, a semiconductor package, which has a substrate with a top surface and a bottom surface and a substrate recess in the bottom surface of the substrate, a first device positioned over the top surface of the substrate, which is at least partially overlapping the substrate recess, a mold material in the substrate recess and overlapping the bottom surface of the substrate adjacent to the substrate recess, a mold recess in the mold material in the substrate recess, a second device positioned in the mold recess, which has the first device positioned to at least partially overlap the second device, and a plurality of interconnect vias in the substrate, which has at least one of the plurality interconnect vias is coupled to the first and second devices to provide a direct signal connection therebetween that minimizes signal latency. In addition, the computer device may include the printed circuit board having a board recess that is aligned with the mold recess.

In another aspect, the computing device 50 may house a board such as a motherboard 501. The motherboard 501 may include a number of components, including, but not limited to, a semiconductor package 500 and at least one communication chip 502. The semiconductor package according to the present disclosure, may be physically and electrically coupled to the motherboard 501. In some implementations, the at least one communication chip 502 may also be physically and electrically coupled to the motherboard 501. In further implementations, the communication chip 501 may be part of a semiconductor package.

Depending on its applications, computing device 50 may include other components that may or may not be physically and electrically coupled to the motherboard 501. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In another aspect, the semiconductor package 500 of the computing device 50 may include a recessed memory device, as described herein.

The communication chip 502 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not. The communication chip 502 may implement any of a number of wireless standards or protocols, including but not limited to Institute for Electrical and Electronics Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 502 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 502 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 502 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 502 may operate in accordance with other wireless protocols in other aspects.

The computing device 50 may include a plurality of communication chips 502. For instance, a first communication chip 502 may be dedicated to shorter range wireless communications such as Wi-Fi and Bluetooth and a second communication chip 502 may be dedicated to longer range wireless communications such as GPS, EDGE, GPRS, CDMA, WiMAX, LTE, Ev-DO, and others.

In various implementations, the computing device 50 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In an aspect, the computing device 50 may be a mobile computing device. In further implementations, the computing device 50 may be any other electronic device that processes data.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A semiconductor package comprising:
   a substrate with a top surface and a bottom surface;
   a substrate recess in the bottom surface of the substrate;
   a first device positioned over the top surface of the substrate, wherein the first device at least partially overlaps the substrate recess;
   a mold material in the substrate recess, the mold material overlapping the bottom surface of the substrate adjacent to the substrate recess;
   a second device positioned in the substrate recess; and
   a plurality of interconnect vias in the substrate, wherein at least one of the plurality of interconnect vias is coupled to the first and second devices to provide an electrical connection therebetween.

2. The semiconductor package of claim 1, wherein the substrate further comprises:
   a substrate core layer;
   a first metallization layer on the top surface of the substrate core layer and a second metallization layer on the bottom surface of the substrate core layer, wherein the substrate recess extends through the second metallization layer and partially through the substrate core layer.

3. The semiconductor package of claim 1, further comprising:
   a mold recess in the mold material in the substrate recess, wherein the first device at least partially overlaps the mold recess and the second device is positioned in the mold recess.

4. The semiconductor package of claim 3, further comprising:
   the substrate recess providing a first angular space and the mold recess providing a second angular space in the substrate recess that is rotationally offset from the first angular space of the substrate recess.

5. The semiconductor package of claim 3, further comprising:
   a printed circuit board with a board recess, wherein the board recess is aligned with the mold recess.

6. The semiconductor package of claim 1, further comprising:
   at least one power plane in the substrate recess connecting the first device to a printed circuit board, wherein the power plane is also connected to a power supply reference voltage.

7. The semiconductor package of claim 1, wherein the plurality of interconnect vias further comprises:
   at least one power plane via connected to the at least one power plane, wherein the power plane comprising a body with a volume that is greater than a volume for the power plane via.

8. The semiconductor package of claim 6, wherein the at least one power plane via is connected to the second device.

9. The semiconductor package of claim 1, further comprising:
   at least one ground plane in the substrate recess connecting the first device to a printed circuit board.

10. The semiconductor package of claim 7, wherein the body of the at least one power plane extends beyond the bottom surface of the substrate.

11. The semiconductor package of claim 1, wherein the mold material further comprises an epoxy polymer resin.

12. The semiconductor package of claim 1, the first device further comprises a central processing unit, a platform controller hub chipset, a graphic processing unit, system on chip, or other processor device, either singly or in combination.

13. The semiconductor package of claim 1, wherein the second device further comprises a memory device or memory package.

14. A method comprising:
   providing a substrate with a top surface and a bottom surface, wherein the substrate further comprises:
      forming a plurality of metallization layers on a substrate core layer as the top and bottom surfaces of the substrate, and forming a plurality of interconnect vias in the substrate, and forming a substrate recess in the bottom surface of the substrate;
   depositing a mold material in the substrate recess and on the bottom surface of the substrate and selectively removing the mold material from the bottom surface of the substrate to form a mold material step overlapping the bottom surface of the substrate adjacent to the substrate recess;
   positioning a first device positioned over the top surface of the substrate, wherein the first device at least partially overlaps the substrate recess and positioning a second device in the substrate recess; and
   coupling the first and second devices to at least one of the plurality interconnect vias to provide a signal connection therebetween.

15. The method of claim 14, further comprising:
   forming at least one power plane in the mold material in the substrate recess.

16. The method of claim 14, further comprising:
   forming at least one ground plane in the mold material in the substrate recess.

17. The method of claim 14, further comprising:
   forming a mold recess in the mold material in the substrate recess, wherein the first device is positioned to at least partially overlaps the mold recess and the second device is positioned in the mold recess.

18. The method of claim 17, further comprising:
   providing printed circuit board with a board recess, wherein the board recess is aligned with the mold recess.

19. A computer device comprising:
   a printed circuit board;
   a semiconductor package, wherein the semiconductor package further comprises:
      a substrate with a top surface and a bottom surface;
      a substrate recess in the bottom surface of the substrate;

a first device positioned over the top surface of the substrate, wherein the first device at least partially overlaps the substrate recess;

a mold material in the substrate recess, the mold material overlapping the bottom surface of the substrate adjacent to the substrate recess;

a mold recess in the mold material in the substrate recess;

a second device positioned in the mold recess, wherein the first device is positioned to at least partially overlaps the second device; and a plurality of interconnect vias in the substrate, wherein at least one of the plurality interconnect vias is coupled to the first and second devices to provide a direct signal connection therebetween.

20. The computer device of claim 19, wherein the printed circuit board further comprises:

a board recess in the printed circuit board that is aligned with the mold recess.

* * * * *